(12) United States Patent
Mihailovich et al.

(10) Patent No.: US 6,417,743 B1
(45) Date of Patent: Jul. 9, 2002

(54) MICRO ELECTROMECHANICAL ISOLATOR (75) Inventors: Robert E. Mihailovich, Westlake Village; Jun J. Yao, Thousand Oaks, both of CA (US)

(73) Assignee: Rockwell Science Center, LLC, Thousand Oaks, CA (US)

( * ) Notice: Subject to any disclaimer, the term of this patent is extended or adjusted under 35 U.S.C. 154(b) by 0 days.

(21) Appl. No.: 09/400,125

(22) Filed: Sep. 21, 1999

(51) Int. Cl.[7] .............................. H03H 9/00; H03H 5/00
(52) U.S. Cl. ..................... 333/24 C; 333/189; 333/186
(58) Field of Search ................... 333/192, 186, 333/189, 191

(56) References Cited

U.S. PATENT DOCUMENTS 5,537,083 A * 7/1996 Lin et al. .................... 333/186

* cited by examiner

Primary Examiner—Robert Pascal
Assistant Examiner—Kimberly E Glenn
(74) Attorney, Agent, or Firm—Craig E. Shinners (57) ABSTRACT

The present invention relates to a micro electromechanical (MEM) isolator in which an input signal induces an output signal by means of electrically insulating mechanical motion. The MEM isolator device comprises a dielectric moveable platform suspended above a substrate by flexible beams. A drive and a control capacitor each have one electrode supported by the platform and one electrode supported by the substrate. Coupling between electrical and mechanical energies is achieved by providing an input signal to the drive capacitor to induce platform motion. When the input signal is fed to the drive capacitor, it actuates electrostatic motion of the platform resulting in a change in the value of the control capacitance. The change in the control capacitance is converted via a simple electronics circuit into an output that mirrors the input but is electrically isolated therefrom. The advantages of such a device include simple electrical isolation provided by the dielectric platform, built in signal-debounce inherent to the structure mechanics, and economical integration with silicon integrated circuits.

19 Claims, 4 Drawing Sheets

MICRO ELECTROMECHANICAL ISOLATOR

FIELD OF THE INVENTION

The present invention relates to isolator devices and more specifically to micro electromechanical (MEM) isolator devices providing isolation between at least one input signal and an output signal.

BACKGROUND OF THE INVENTION

Isolator devices (isolators) are often used to provide electrical or acoustical separation between two locations or environments. Isolators are commonly found in factory and telecommunication applications to prevent interaction between circuits on either side of the isolator.

Prior art isolators include optical coupling devices that convert an electrical signal to an optical signal and then convert the optical signal back to an electrical output signal. In optical coupling systems, the electrical signal drives a light emitting diode to generate light pulses that are received at a detector. The detector then converts the light pulses back into an electrical signal. Since the detector output is electrically isolated from the diode, transients are not propagated from the input to the output. Unfortunately, optical isolators are expensive to manufacture and operate. Optical isolators use expensive gallium arsenide (GaAs) substrates and exhibit high operating power and limited lifetime. Further, optical isolators are not well suited to analog applications since it is difficult to transfer signal analog voltage signals due to the difficulty in detecting variations in the light pulse responsive to intermediate voltage levels.

Isolation transformers are well known and used in many applications since they have low power consumption and provide magnetic (flux) coupling between one or more pairs of circuits without introducing either significant ohmic (conductive) or electrostatic (capacitive) coupling. The isolation transformer has low power requirements, but transformers are heavy, bulky discrete components that depend on separate wire windings on a steel core. Although the windings are electrically insulated from one another, a transformer may transfer high frequency transients from one environment or circuit to the next so the protected environment may require additional protection circuits to filter out the transients. Further, although transformers are able to convert alternating current (AC) to direct current (DC), transformers are unable to provide isolation for DC to DC applications.

Capacitive coupling devices also have low power consumption but similarly have large discrete electrical components that add to system size and weight and are susceptible to electrical failure if stressed under certain conditions. Further, capacitive coupling devices inherently couple harmful transients from the input to the output.

Further, with many prior art isolators, an additional external circuit is required to debounce the output signal to prevent introduction of spurious noise. This additional circuit increases power consumption and cost to isolate the desired signal.

Notwithstanding the problems with the various types of isolators known in the art, isolators are required in a variety of applications. For example, in tele-communication applications, it is common for signals transmitted through a switching network to have voltage and current levels that are incompatible with telephone or computer devices such as modems and similar equipment. Accordingly, an isolator may be used to isolate the head end of the network from remote terminal equipment while still permitting the signal information content to be transmitted between different electrical environments. Further, since environmental factors can affect the signal in transit, there is a need to remove potentially harmful transient signals (such as lightning induced transients) before the terminal equipment is damaged. Further still, it is also desirable to separate circuit grounds so that improperly grounded equipment will not disrupt the operation of the remainder of the switching network.

Similar applications arise in the industrial control environment since automation is becoming an increasingly important part of producing high quality products at competitive prices. As processing equipment becomes more sophisticated and interconnected to other equipment by local area networks or other communication means, control and processing information is generated that must be timely transferred to a server or other processing equipment as well as a noise-free ground reference. In general, isolators are often employed where a signal is generated in a first hostile environment and it is necessary to convey the information content of the signals to a second environment without conveying those signal parameters that are potentially damaging. As noted above, another main function of isolators is to isolate grounds between electrical circuits that are in communications with each other. Having separate matched zero potential conductors on one side compared to the noisy ground from the input other is desirable for noise and safety reasons.

Thus, whatever the advantages of the prior art isolator devices, there is a need for an inexpensive, lightweight, low power, isolator device that has isolation characteristics comparable to prior art isolator devices.

SUMMARY OF THE INVENTION

The present invention relates to an isolator based on moveable micro electromechanical (MEM) structures. The general principle is to have at least one electrical input signal control an output signal by way of mechanical motion of an electrically insulating MEM structure. The MEM isolator device comprises a moveable platform suspended above a substrate and a drive and a control capacitor each having a movable electrode supported by the platform and a stationary electrode supported by the substrate. The moveable and stationary electrodes of each capacitor are separated by an air gap so the capacitance changes as a function of the distance between electrodes of the capacitors. By sensing the change in the output capacitance, it is possible to regenerate the input signal at the output. Electrically insulating coupling between the input and the output signal is achieved by converting electrical energy to mechanical energy. This conversion is achieved by providing an input signal to the drive capacitor to induce electrostatic platform motion. This motion induces a corresponding change in the control capacitance that is detected by a control circuit. The control circuit then produces an output signal that follows the input signal but is electrically isolated therefrom.

More specifically, the drive capacitor is coupled to a signal source and when a signal applied across the drive capacitor, an electrostatic force is generated causing the electrode mounted on the moveable platform to move either toward or away from the fixed electrode. This electrode motion converts electrical energy into mechanical energy. The mechanical motion of the platform transfers the mechanical energy to the control capacitor and since the value of the capacitance is proportional to the distance (1/d)

between the electrodes of the capacitor, the capacitance value increases when the gap spacing is decreased. Similarly, as the gap spacing is increased, the capacitance value of the capacitor will decrease. Since the value of the capacitance is proportional to the distance (1/d), the value of the capacitor increases when the gap spacing is decreased and as the gap spacing is increased the capacitance value of the capacitor will decrease. The change in the value of the control capacitor is measurable and used to determine the magnitude of the input voltage. Advantageously, the isolator of the present invention is capable of isolating both AC and DC signals.

In the preferred embodiment, the moveable electrodes of both the drive and the control capacitors are mounted on a common insulating platform so that there is no electrical connection between the drive and control capacitors. The isolator device of the present invention provides isolation voltage levels on the order of several thousands of volts limited only by the breakdown voltage of the insulating material. The isolator of the present invention protects one side of a circuit from harmful signal components while permitting the transfer of the signal content. Further, separate grounds are readily provided with the present invention since the isolator may couple either digital or analog signals from one environment to another.

Depending on design parameters, a data rate of ten thousand bits per second (10,000 bps) is readily achieved. However, if significantly higher data rates are necessary, the signal size will degrade since the resonant frequency of the structure is inversely proportional to square root of the mass. Thus, higher signal rates require smaller capacitors resulting in smaller signal size. Compared to optical isolator devices, active isolators or transformers, power consumption is significantly reduced with the present invention with minimal power consumption on the order of only a few microwatts. The isolator device of the present invention may be integrated together with control circuits as a single component using flip-chip technology. Advantageously, the present invention also provides a signal debounce feature that filters spurious high frequency signals.

The MEM structure is fabricated using well-known semiconductor processing techniques to define and release the microstructure from single-crystal silicon material resulting in an isolator device that is small and lightweight.

DETAILED DESCRIPTION

According to the principles of the present invention, a new, small, low power micro electromechanical isolation device is disclosed having good isolation characteristics. Specifically, the present invention provides a device that receives an electrical signal and induces an output signal via an electrically insulating mechanical coupling means. In the following description, numerous specific details are set forth in order to provide a through understanding of the present invention. However, it will be apparent to one of ordinary skill in the art that these specific details need not be used to practice the present invention. In other instances, well known structures, circuits and interfaces have not been shown in detail in order not to unnecessarily obscure the present invention.

Figure 1:
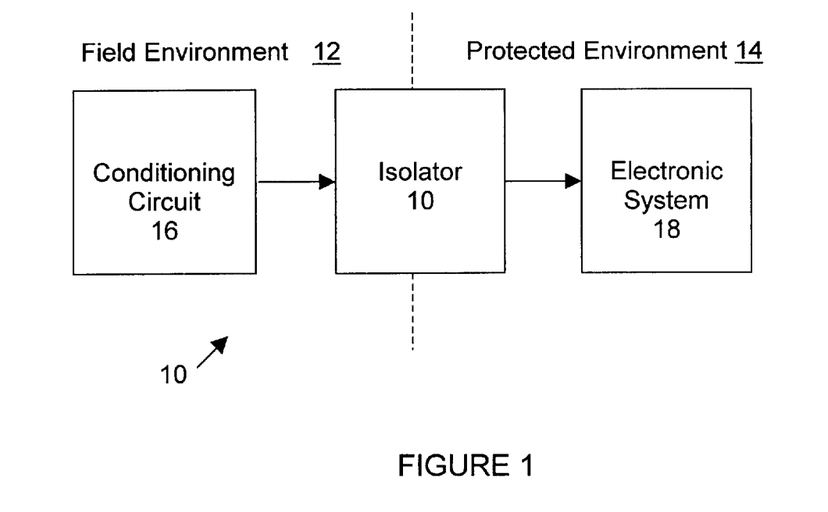
FIG. 1 illustrates a common electronics application for an isolation device in accordance with the present invention.

Referring now to FIG. 1, a common electronics application is illustrated where isolation of two signals is necessary. An isolator 10 shown coupling signals generated in a field environment 12 to a protected environment 14 provides signal isolation. Field environment 12 is a potentially harsh and noisy environment such as may be experienced in telecommunications or industrial control applications so any signal generated in or transferred through environment 12 could be dirty and susceptible to noise spikes and other induced transients. By way of example, the field environment may comprise a communications network, such as a dial-up telephone system or other telecommunication network, where a switching network establishes a connection between a head end and terminal equipment such as a computer in the protected environment. In another example of the field environment, sensors on the factory floor generate signals that are transferred to the protected environment 14 for monitoring by a server or other similar equipment.

During operation, signals generated in environment 12 are applied to the input of isolator 10. An optional analog to digital converter 16 conditions any analog signal before it is coupled to isolator 10. In protected environment 14, electronic system 18 is coupled to the output of isolator 10. Electronic system 18 may be a microprocessor or a terminal device such as a modem or a telephone. Isolator 10 functions, by way of example, to protect electronic system 18 from harmful transients imposed on the signals by spurious noise or other environmental factors. Isolator 10 may also couple a ground reference from the field to the protected environment so that potentially harmful ground loops or floating grounds will not be transferred to protected environment 12.

Figure 2:
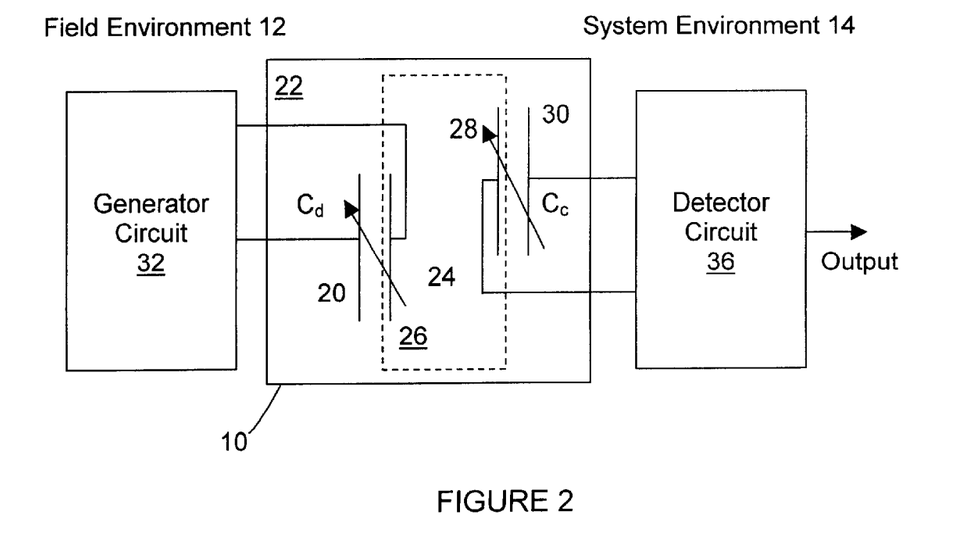
FIG. 2 is a schematic representation of an isolation device in accordance with the present invention.

FIG. 2 illustrates, in schematic form, an isolator device 10 in accordance with the present invention. Isolator device 10 comprises a drive capacitor, $C_d$, having a fixed electrode 20 coupled to a substrate 22 and a movable electrode 24 coupled to a moveable mass 26. Electrodes 20 and 24 are separated by an air dielectric. A second movable electrode 28 is also mounted on mass 26. Electrode 28 in combination with fixed electrode 30 forms a control capacitor, $C_c$. Electrodes 28 and 30 are also separated by an air gap.

A generator circuit 32 in the field environment 12 (represented as being to the left of dotted line 34) is electrically coupled to fixed electrode 20 of $C_d$. Generator circuit 32 may, by way of example, be a machine on a factory floor that communicates with a remotely located server (not shown) in protected environment 14 (represented as being to the right of dotted line 34).

In protected environment 14, a detector circuit 36 detects changes induced in the capacitance of $C_c$ and generates a signal responsive to the electrical signal generated by circuit 32. In operation, the input signal generated by circuit 32 actuates electrostatic platform motion of mass 26. Displacement of mass 26 causes electrode 28 to move thereby inducing a change in the capacitance of $C_c$. Detector circuit 34 detects the change in capacitance of $C_c$ and an output signal is generated in response to the input signal. Since there is no electrical connection between capacitors $C_d$ and $C_c$, the output signal is electrically isolated from the input signal applied to electrode 20. As should be apparent to one of ordinary skill in the art, the specific details of generator circuit 32 and detector circuit 36 are dependent on the particular application and as such, specific details as to design or operation are considered to be merely an engineering choice.

The operating characteristic of isolator device 10 is determined in large part by the electromechanical properties of mass 26. These characteristics include the maximum rate for data transfer, built-in signal debounce, isolation quality, power consumption and noise immunity.

Figure 3:
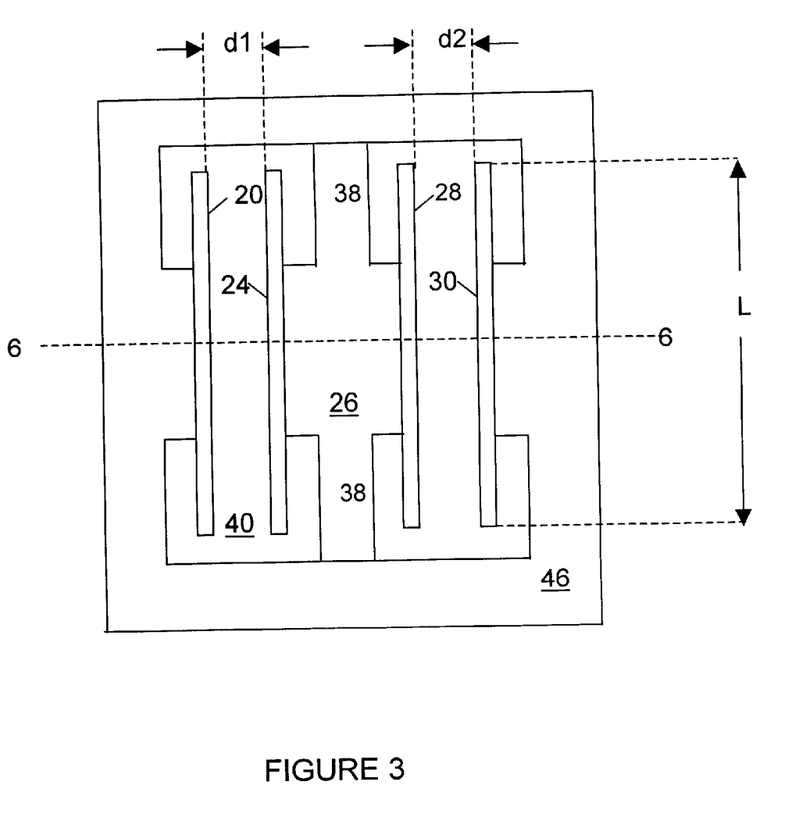
FIG. 3 shows a top view of the isolation device and specifically the suspended platform that supports movable electrodes of a drive and control capacitor in proximity to the respective stationary electrodes.

Referring now to FIG. 3, isolator 10 is illustrated in greater detail with a top view of suspended platform 26 and capacitors $C_d$ and $C_c$ shown. The dimensions of isolator 10 are not drawn to scale since the purpose is to merely demonstrate the relationship between various elements of the isolator in a manner that is readily comprehended. Platform 26 is a suspended microstructure supported by beams 38 above a substrate 40. Platform 26, capacitors $C_d$ and $C_c$ and beams 38 are formed from a top or cap substrate 46 and coupled to substrate 40.

Beams 38 act as a set of "springs" that flex in response to application of a voltage applied to the fixed electrode 20 of capacitor $C_d$. The dimensions of beams 38, specifically, the length and width, are determined in part by the particular application. For example, when the expected voltage levels of input signals applied to plate 20 are relatively low (that is, in a range of about zero to 5.0 volts) beams 38 must be sufficiently flexible such that structural motion is actuated in response an applied signal. In one preferred embodiment where the range of input voltages is from zero to 5.0 volts, beams 38 have a spring constant of about one Newton/meter (1.0 Nt/m). To obtain this spring constant, beams 38 will each have a length of about 500 µm, a width of 2 µm and a height of 10 µm. For higher voltages, beams 38 may be designed to be less flexible by increasing the width or decreasing the length. By depositing a layer of metal (See FIG. 4) on top of beams 38, electrical connection to the moveable electrodes 20 and 24 may be routed to a pad or other circuits.

The operating characteristics of isolator 10 also depend on the dimensions of the capacitors $C_d$ and $C_c$. In general, the capacitance (and accordingly the operating characteristic) is determined by the area of the electrodes, that is the respective length, L, and the height, H (see FIG. 6), the distance (d1 and d2) defining the air gap between the electrodes and the dielectric constant of air, $\in_o$. By way of illustration, if a 100 fF capacitor is desired for a particular application, each electrode will be about 1000 µm long and 10 µm high with an air gap between the electrodes of about 2 µm. Based on these dimensions, the capacitors in this embodiment will have a drive coefficient of 0.008 µmV² where the drive coefficient is a measure of structural movement in response to an applied voltage, the spring constant and capacitance value. More specifically, the drive coefficient defines displacement as a function of the capacitance value and the spring constant and the square of the applied voltage:

Drive coefficient=Force/Spring Constant=$(0.5*(C/G)*V^2)/K$

Where "C" represents the capacitor value and "G" represents the gap spacing. For a nominal position, the value for C is about 100 fF, the value for G is about 0.2 µm and the value for the spring constant, K, is 1 Nt/m. Thus for the illustrated embodiment, deflection of the movable platform will be about 0.2 µm in response to application of a drive voltage of 5.0 volts. The corresponding change in capacitance will be about 10 fF for such a displacement.

Depending on the intended application, the operating characteristics are readily modifiable for a variety of applications. For industrial applications where expected signal levels will be between zero and 5.0 volt, a spring stiffness of about 2 Nt/m provides a resonance frequency of about 10 Khz and maximum data rate of about 4 Kbytes/sec. To obtain the spring constant of 2 Nt/m, each beam 38 will have a length of about 400 µm and a width of about 2 µm. The height dimension is determined by the thickness of cap substrate 46, which in the representative embodiment is about 10 µm. The target capacitance of the isolator is about 100 fF derived from the dimensions of electrodes. In the preferred embodiment, the height of the capacitor is about 10 µm, which is determined by the thickness of cap substrate 46, the length of the electrode plate is about 1000 µm and the gap distance is about 2 µm. For telecommunication applications, expected voltage signals have a much higher range (between 0 and 48 volts) and a stiffer spring constant is required for a 100 fF capacitor. For example, beams 38 will be about 300 µm long with a height and width of about 10 µm and 2 µm respectively. The spring constant is about 40 Nt/m for beams having these dimensions. This isolator device achieves a 40 Kbytes/second maximum data rate and a resonance frequency of about 100 KHz. By selectively designing beams 38 to provide a selected spring constant, the isolator of the present invention can readily be matched to the anticipated signal environment.

Figure 4:
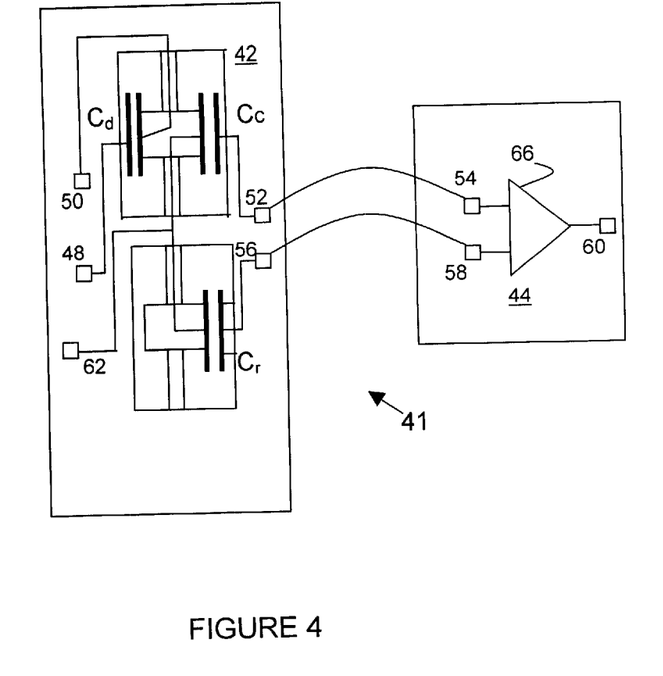
FIG. 4 illustrates one representative embodiment of an isolator device of the present invention configured as a comparator circuit.

FIG. 4 illustrates one representative embodiment of a comparator conversion circuit 41 using the isolator device of the present invention. In this embodiment, a first isolator device 42 has input 48 coupled to generator circuit 32 (see e.g., FIG. 2) for receiving an input signal from the field environment. The input signal is applied to the fixed plate of $C_d$. Moveable electrode 26 connects to output 50, which may be the ground reference provided from field environment 12. Output 52 couples fixed electrode 30 of $C_c$ to a detector circuit 44. By way of example, wire bonding or flip chip technologies may be used to couple output 52 to detector circuit 44 to enable compact packaging. Detector circuit 44 includes an operational amplifier 46 having its inverting input 54 coupled to output 52. As with the above-described embodiments, the suspended platform couples movable electrode of $C_d$ to the movable electrode of $C_c$.

Circuit 41 further includes a reference capacitor $C_r$ connected to output 56. Output 56 is coupled to the non-inverting input 58 of amplifier 46. Capacitor values are chosen so the capacitance of $C_c$ is slightly larger than the capacitance of the reference capacitor $C_r$. One manner of adjusting the capacitance value of the capacitors is to adjust the dimensions of respective capacitors $C_r$ and $C_c$. Thus when a low signal level is applied to input 48, the voltage relations at amplifier 46 will be $V_{54} > V_{58}$, causing the amplifier output to be at a low signal level. When a logic high signal is applied at input 48, the change in the voltage at output 52 is higher than the level applied to reference output 56. Accordingly, the voltage relation at the inputs to amplifier 46 is $V_{54} < V_{58}$, and output 60 of amplifier 46 will be at a high voltage level. A reference bias voltage is applied to input 62 such as Vcc or other selected voltage level that will minimize noise margin problems at the input to amplifier of detector 44.

Figure 5:
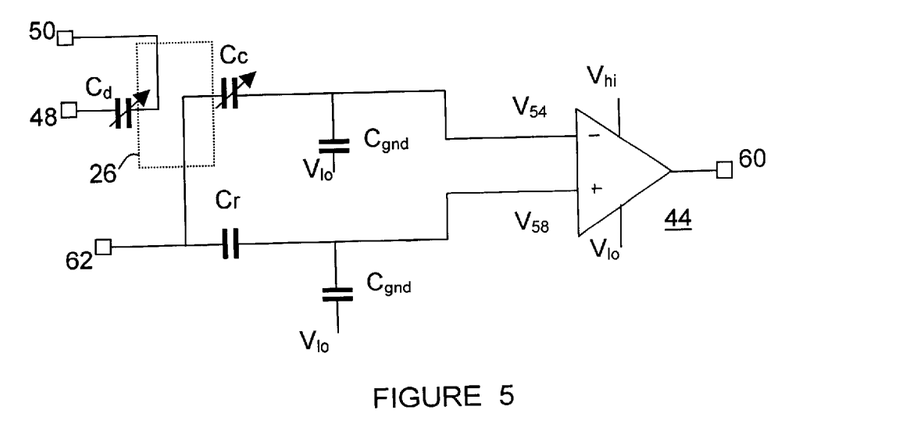
FIG. 5 is a schematic representation of the isolator device shown in FIG. 4 configured as a comparator.

FIG. 5 shows a schematic representation of the isolator device configured as a comparator. When a signal is applied across terminals 48 and 50, electrostatic displacement of movable electrode of $C_d$ induces movement of platform 26. Displacement of platform 26 causes a corresponding change in the capacitance of capacitor $C_c$. Accordingly, with a static voltage $V_{hi}$ applied at a reference terminal 62, the voltage at each input of amplifier 46 is a function of the ratio of the respective capacitance values. Specifically, the voltage at inputs $V_{54}$ and $V_{58}$ is approximately:

$$V_{54} \sim C_c/C_{gnd}$$

$$V_{58} \sim C_r/C_{gnd}$$

where the reference capacitor is coupled to a stationary platform and, accordingly, the value of $C_r$ is static and not affected by the signal applied at the input of isolator 42. Typical values of $C_{gnd}$ are approximately 1.0 pF. This value includes capacitance due to wiring and stray capacitance. The resulting voltage change at the output of the operational amplifier will be about 25 mV if $C_{gnd}$ is about 1.0 pF.

The highest rate of data transfer is determined by the mechanical resonance frequency of the composite structure of mass 26 and beams 38. The resonance frequency is the determined by the following formula:

$$f_r = (K/M)^{1/2}$$

The stiffness or spring constant K is determined by the dimensions of beams 38 and the elastic modulus of the material, primarily the semiconductor material comprising the cap substrate 46. The height, width and length and the elastic modulus of the beam are combined in accordance with the following formula:

$$K = E \times (W^3 \times H)/L^3$$

With respect to the mass of the structure, the mass of the beams must be included in the mass calculations for a uniform structure. However, as will be readily apparent, as the platform becomes large when compared to the mass of the beams, the beam effect becomes less significant. It is also noted that metal is the most significant contributor to the mass of the overall structure so electrodes 24 and 28 will contribute a significant portion of the total mass. In the embodiment shown in FIG. 2, the structure has an estimated mass of about $1.0 \times 10^{-6}$ grams (1.0 μg) and a spring constant of 1 Nt/meter. The resulting resonance frequency is about 5 kHz and the isolator device will be operable for input signal frequencies up to about the resonance frequency. For an input signal comprising digital data consisting of 8 bits words, the signal frequency would limit sample rates to about 600 samples per second. If the data consists of 16 bits, the maximum sample rate would be 300 samples per second.

One very advantageous feature of the resonance-limited response is that it provides built-in signal debounce since the amplitude of microstructure motion decreases with drive frequency at a rate of 10 dB per octave above the resonant frequency. Thus for the above described structure, with a resonance frequency of 5 kHz, structure motion in response to 40 Khz signals will be 80 dB smaller than for the 1 kHz signals. This damping of high frequency motion (and hence absence of high frequency "bounce" signals) is achieved without external circuitry.

The isolation between input and output signals is high with the isolator of the present invention. It should be apparent that the maximum potential difference is set by the breakdown fields of the dielectric between the respective conductors on platform 26. For typical semiconductor processing parameters, the breakdown value is well in excess of 1.0 Megavolt (MV). With signal line spacing of about 100 μm, this breakdown level permits a maximum input voltage exceeding 10 kV without undesirable coupling to the amplifier 44. Moreover, since signal isolation is affected by capacitive coupling (typically under 0.001 fF) between adjacent signal lines on platform 26, the line-to-line impedance at 1 kHz will actually be much greater than a giga-ohm. Moreover, the maximum potential difference may be further improved by increasing line-to-line separation.

Power consumption of device 10 is very low. Power use of the mechanical element stems from actuation of the platform motions, achieved by charging up small value capacitors in the range of 100 fF. Typical charging currents are on the order of a microampere (1 μA) and drive voltages are approximately about 50V so power consumption is about 50 μW. The power consumption of the control circuit is also minimal since only one operational amplifier is needed at the output of device 10.

One device characteristic unique to this MEM device of the present invention is potential susceptibility to mechanical noise. This susceptibility stems from the microstructure geometry where the suspended large-mass structure acts as an accelerometer. Thus, acceleration induced mechanical motion may cause a change in the control capacitor that is unrelated to the input signal. Fortunately, this susceptibility can be greatly minimized by using a reference capacitor having geometry nearly identical to that of the control capacitor. Acceleration-related displacements of the reference capacitor will match those of the control capacitor so that the motion induced voltage change at the amplifier inputs results in no net voltage difference.

Where the application requires a data rate of approximately 16 Khz (that is, 16 bits of data sampled at a sample rate of 1 kHz), device 10 must have its resonant frequencies over 50 kHz. However, there exits a fundamental tradeoff between maximum response speed and maximum signal level. Since signal level is proportional to capacitor size, the major source of mass that affects the resonant frequency is the size of the drive capacitor. Lumped-parameter expressions for platform frequency, f, and displacement, x, as a function of capacitor dimensions is:

$$f \sim 1/(M)^{0.5} \sim 1/(A + \rho * H * L * W)^{0.5}$$

$$x \sim C \sim H * L * W$$

Where A is the structure mass from components other than the drive capacitor (that is the platform, beams and control capacitor), ρ represents material density of the drive capacitor and the height, H, length, L, and width, W, of the electrode mounted on the moveable platform. Decreasing the dimensions of the drive capacitor increases the structure's resonant frequency but diminishes the maximum signal level. Thus, there is a tradeoff between maximum data rate and maximum signal level.

Isolator device 10 must be capable of operating within the range of standard acceptable levels characteristic of the logic family. In one preferred embodiment, the logic family is CMOS logic integrated on a common substrate with the isolator device. One potential problem is the range of the signal inputs the device must convert correctly. In particular, the device must recognize voltage inputs from –0.4 V to 1.5 V as a low logic signal and voltage inputs from 4.6 V to 5V as a high logic level. The electrostatic actuation relation suggests that this input voltage range should not be problematic for the proposed device since the actuation force, and hence platform deflection, is proportional to the square of the input voltage. Thus, the smallest value for the ratio of the high displacement to the low displacement will be:

$$(x_{hi}/x_{lo})\min=(V_{himin}/V_{lomax})^2=(4.5/1.5)^2=9$$

In general, if the displacement ratio approaches 10 or greater, the displacement is sufficiently robust to generate detectable change for the selected logic family input level signals. It will be apparent to one skilled in the art that the input to the isolator device need only be sufficient to induce motion of the platform and is not intended to be limited to applications of 5.0 volt logic levels. Clearly, the input signal may be an acoustical signal or other signal or condition capable of inducing motion of the platform.

One risk that must be addressed in the design of the isolator device of the present invention is achieving control of the mechanical and electrical parameters. Mechanically, the microstructures must have dimensions so that the stationary structure has a control capacitance slightly higher than the reference capacitor, and the displaced structure has a control capacitance smaller than reference capacitor. This means that the capacitor-plate air gaps must be controllable, as well as the structure spring constants. These dimensions are determined by lithography and etching processes, both of which are well-characterized processes.

Figure 6:
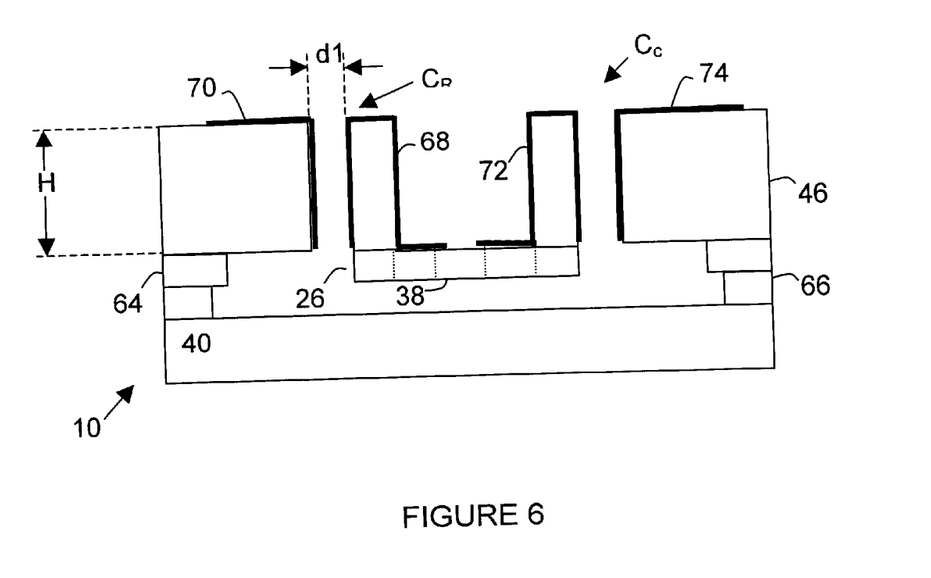
FIG. 6 illustrates a diagrammatic side view of the isolator of FIG. 3 along section line 6—6.

Referring now to FIG. 6, a cut-away side view of the isolator 10 of FIG. 3 is illustrated. Specifically, a substrate 40 supports the entire device. Substrate 40 may be a common silicon device used for processing semiconductor devices. A top substrate 46, having a dielectric layer of oxide 64 on one side, is disposed on top of substrate 40. A layer of epoxy 66 couples substrate 40 to top substrate 46. During processing, substrate 46 is patterned and etched to define the capacitors $C_d$ and $C_c$ and to remove the substrate material from platform 26 as well as between the electrodes of the capacitors. It should be apparent that the height, H, of capacitors $C_d$ and $C_c$ is determined by the thickness of substrate 46. A selective etch then removes the dielectric layer 64 to define beams 38 and platform 26. During the etch process the epoxy layer is also removed to free platform 26 and to permit movement. It should be readily apparent that the epoxy layer and the dielectric layer need not be etched in a single etch process step but may in fact comprise two or more mask and etch steps if dictated by a particular design consideration. A layer of metal is then deposited and patterned to form the electrode plates as well as the conductors 68–74 that couple the electrodes to the appropriate inputs or outputs (see, e.g., FIG. 4).

The substrates and technology for fabricating the proposed device is primarily dictated by the need to realize millimeter-sized structures. Such large structures are preferably fabricated from single-crystal substrate material since structures from polycrystalline materials tend to exhibit stress-related non-planar dislocations over temperature or operating extremes.

There are two preferred fabrication technologies for fabricating the isolator devices of the present invention. One fabrication technology employs a silicon-on-insulator (SOI) substrate. Such substrates are commercially available from a variety of sources with a 20 μm thick epitaxial silicon layer already applied. Structures defined by the epitaxial silicon are released by a selective wet-chemical etch of the insulator substrate.

Another fabrication technology involves bonding two wafers using electronic-grade epoxy adhesive. One wafer is thinned to structure thickness by lapping and polishing while the other wafer serves as a substrate for the structure. Free-standing microstructures are formed by patterning and etching the structure wafer and undercutting these structures by etching the underlying epoxy in an isotropic O2 plasma to release the structure. This fabrication technology is more fully described in U.S. Patent application Ser. No. 09/075, 008 filed May 8, 1998 now U.S. Pat. No. 6,159,385, which issued Dec. 12, 2000, entitled Process for Manufacture of Micro Electromechanical Devices Having High Electrical Isolation and originally assigned to Rockwell Science Center LLC, the assignee of the present invention, the disclosure of which is incorporated herein by reference.

Although the invention has been described herein with reference to a specific embodiment, many modifications and variations therein will readily occur to those skilled in the art. Accordingly, all such variations and modifications are included within the intended scope of the present invention as defined in the following claims.

We claim:

1. An isolator device for coupling a first signal to an output signal comprising:

A substrate;

A drive capacitor having opposing planar stationary and movable electrodes for converting said first signal to mechanical motion;

A control capacitor having opposing planar stationary and moveable electrodes for converting mechanical motion to an electrically isolated output signal responsive to said first signal; and An electrically insulated microstructure having a selected mass and supported by a pair of beams above said substrate, said microstructure supporting said movable electrode of said drive capacitor and said movable electrode of said control capacitor so that movement of the movable electrode of said drive capacitor displaces said microstructure and said moveable electrode of said control capacitor, said microstructure determining the resonance frequency response of said isolator device.

2. The device of claim 1 further including an operational amplifier coupled to said control capacitor for converting changes in capacitance of said control capacitor to said output signal.

3. The device of claim 1 wherein said movable electrode of said drive capacitor is supported by said platform and said stationary electrode is supported by said substrate in alignment with said movable electrode such that application of said first signal to said stationary electrode actuates electrostatic motion of said movable electrode and said microstructure.

4. The device of claim 3 wherein said first signal is a digital signal.

5. The device of claim 4 wherein said microstructure, beams and moveable electrodes have a combined mass associated therewith, said mass limiting the motion of said microstructure in response to high frequency signal components of said first signal higher than said resonance frequency.

6. The device of claim 1 wherein said substrate comprises a silicon substrate coupled by an epoxy layer to a cap substrate.

7. The device of claim 6 wherein said cap substrate is coupled to said microstructure by said pair of beams.

8. An isolator device comprising:

A substrate;

An insulating movable coupling platform suspended above said substrate;

A first capacitor having a pair of opposing planar electrodes, one of said pair of electrodes supported by said coupling platform and a stationary one of said pair of electrodes supported by said substrate such that an applied digital signal to said first capacitor actuates electrostatic motion of said platform;

A second capacitor electrically isolated from said first capacitor having a pair of opposing planar electrodes, one of said pair of electrodes supported by said coupling platform and a stationary one of said pair of electrodes supported by said substrate such that motion of said platform changes the capacitance of said second capacitor; and Circuit means for producing an output signal responsive to changes in said applied digital signal, said circuit means coupled to said second capacitor, said output signal having a resonance-limited frequency response.

9. The isolator device of claim 8 further comprising means for supporting said platform, said support means coupled to said substrate.

10. The isolator device of claim 8 further comprising a pair of beams for supporting said platform, said beams having a selected spring constant; said isolator device having a resonance frequency determined by said beams and said platform where said resonance frequency determines a maximum data transfer rate.

11. The isolator device of claim 10 wherein said flexible beams each support at least one conductor for making an electrical connection to said movable electrode of said first and second capacitors.

12. In a signal transmission system, a system for mechanically coupling a first signal comprising a stream of digital pulses to an output electrical signal, said coupling system comprising:

A composite substrate having a silicon substrate coupled by an epoxy layer to a cap substrate;

A suspended platform coupled to said cap substrate by a pair of flexible supporting beams such that said platform is movable, relative to said composite substrate, the mass of said platform determining the resonance frequency response of said mechanical coupling system;

A drive capacitor having a planar stationary electrode coupled to said substrate and an opposing planar movable electrode coupled to said platform in proximity to said stationary electrode, at least one of said beams having an electrical conductor forming an electrical connection to said movable electrode; said platform being laterally displaced in response to said first signal; and Second means, coupled to said drive capacitor by said platform, for converting the lateral displacement of said platform to a second electrical signal responsive to said first signal, said second electrical signal being electrically isolated from said first signal.

13. The signal transmission system of claim 12 wherein said second converting means comprises:

A control capacitor having a planar stationary electrode and an opposing planar movable electrode, said stationary electrode of said control capacitor supported by said supporting means and said movable electrode of said control capacitor electrically isolated from said movable electrode of said drive capacitor, said movable electrode of said control capacitor supported by said platform in proximity to said stationary electrode of said control capacitor, at least one of said beams having an electrical conductor forming a connection to said movable electrode of said control capacitor such that lateral displacement of said platform changes the capacitance value of said control capacitor; and A detection circuit coupled to said stationary and movable electrodes of said control capacitor for generating an output signal responsive to said change in the capacitance value of said control capacitor.

14. The signal transmission system of claim 12 wherein said support means comprises a silicon substrate coupled to said stationary electrodes by an epoxy layer.

15. A logical device having at least one input electrically isolated from an output, said logical device comprising:

A first micro electromechanical device having at least one electrical input coupled by a movable platform to an output;

A second micro electromechanical device having a stationary platform, said second micro electromechanical device providing a reference level; and A comparator for comparing the output of said first micro electromechanical device with said reference level, said comparator having an output indicating the result of said comparison, said comparator having a first input connected to said first micro electromechanical device and a second input connected to said second micro electromechanical device.

16. The logical device of claim 15 wherein said electrical input further includes a drive capacitor having a stationary electrode coupled to said electrical input and a movable electrode coupled to said movable platform.

17. The logical device of claim 16 wherein said output further includes a control capacitor having a stationary electrode coupled to said comparator and a movable electrode coupled to said movable platform such that motion of said platform in response to an applied electrostatic force at said input changes the capacitance at said output of said second micro electromechanical device.

18. The logical device of claim 17 wherein said second micro electromechanical device further includes a reference capacitor having a pair of stationary electrodes, one of said stationary electrodes coupled to said movable electrode of said control capacitor and a second of said stationary electrodes coupled to coupled to said comparator; each of said pair of stationary electrodes having dimensions substantially identical to the dimensions of said stationary and said movable electrode of said control capacitor.

19. The logical device of claim 18 wherein the size of said drive capacitor determines the resonate frequency of said logical device.

* * * * *